United States Patent
Tullstedt et al.

(10) Patent No.: US 6,252,769 B1
(45) Date of Patent: Jun. 26, 2001

(54) DEVICE FOR INCREASING HEAT TRANSFER

(75) Inventors: Carl Henrik Tullstedt, Björkholmsvägen; Patrik Bergman, Östanbräcksvägen; Anders Edgren, Renstiernasg., all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/457,862

(22) Filed: Dec. 10, 1999

(30) Foreign Application Priority Data

Dec. 11, 1998 (SE) .................................................. 9804299

(51) Int. Cl.$^7$ ...................................................... H05K 7/20
(52) U.S. Cl. .......................... 361/694; 361/690; 361/692; 174/15.1; 174/16.1; 174/16.3; 454/184
(58) Field of Search ..................... 361/673, 689, 361/690, 694, 695, 698, 699; 165/122, 185; 417/436, 410.1; 415/125

(56) References Cited

U.S. PATENT DOCUMENTS

| | | | |
|---|---|---|---|
| 4,063,826 | * 12/1977 | Riepe | 417/436 |
| 4,498,851 | * 2/1985 | Kolm et al. | 417/410.1 |
| 4,780,062 | * 10/1988 | Yamada et al. | 417/410.1 |
| 4,834,619 | * 5/1989 | Walton | 417/53 |
| 4,923,000 | * 5/1990 | Nelson | 165/122 |
| 5,104,626 | * 4/1992 | Yang | 417/436 |
| 5,522,712 | * 6/1996 | Winn | 417/436 |
| 5,914,856 | * 6/1999 | Morton et al. | 361/690 |
| 6,043,978 | * 3/2000 | Mody et al. | 361/690 |

FOREIGN PATENT DOCUMENTS

| | | |
|---|---|---|
| 0 601 516A1 | 6/1994 | (EP) . |
| 08330488 | 12/1996 | (JP) . |
| 508 435 | 10/1998 | (SE) . |
| 96/00849 | 1/1996 | (WO) . |
| 98/54765 | 12/1998 | (WO) . |

OTHER PUBLICATIONS

Petterson, "Infraljuds inverkan på värmeövergångstalet", R15:, Statens Byggforskningsråd, Stockholm, ISBN 91–540–4979–2, 1989; (Comment: English summary in chapter 13).

Liljencrants, "Elektroakustik", Stockholm, ISSN 0280–9850, pp. 5–16, 1993.

* cited by examiner

Primary Examiner—Leo P. Picard
Assistant Examiner—Boris L. Chervinsky
(74) Attorney, Agent, or Firm—Burns, Doane, Swecker & Mathis, L.L.P.

(57) ABSTRACT

A device for increasing heat transfer from an object includes at least one oscillating membrane for generating air motion in air surrounding the object, and a nozzle for affecting the air motion so that the air motion causes a continuous exchange of the air surrounding the object.

20 Claims, 4 Drawing Sheets

DEVICE FOR INCREASING HEAT TRANSFER

This application claims priority under 35 U.S.C. §§119 and/or 365 to 9804299-7 filed in Sweden on Dec. 11, 1998; the entire content of which is hereby incorporated by reference.

TECHNICAL FIELD

The present invention relates to the field of devices for increasing the heat transfer from an object.

DESCRIPTION OF PRIOR ART

Technical equipment often comprises electronics (or other objects) which needs to be cooled, on one hand to prevent the electronics and other adjacent equipment from being overheated, on the other hand to prevent persons who come into contact with the technical equipment from getting burned.

One way of cooling the electronics is to arrange the electronics in a good thermal contact with a heat sink, which has a relatively large heat transferring surface from which heat is transferred to the surroundings (e.g. surrounding air). The heat sink is usually made of a material with relatively good thermal conductivity and usually comprises heat dissipators, such as cooling flanges or similar, to increase the heat transferring surface.

However, the heat sink usually requires a relatively large amount of space, which of course is a disadvantage for such technical equipment that cannot take a lot of room.

There are, however, ways to increase the heat transfer from the heat sink so that the size of the heat sink can be decreased.

One way to increase the heat transfer is to use fans or similar means to generate an air motion in the air surrounding the heat sink. However, the fans have a disadvantage in that they generate disturbing noise. The fans have another disadvantage in that they require maintenance, for example due to lubricant in the bearings of the fans getting old and therefore must be replaced at certain time intervals. The fans have a further disadvantage in that they take a relatively large amount of room.

Another way to increase the heat transfer from a heat sink is to use an infra-sonic generator to generate an air motion in the air surrounding the heat sink. In a report (Bengt Petersson, 1989, "Infraljuds inverkan på värmeöverg ångstalet", R15:1989, Statens Byggforskningsrad, Stockholm, ISBN 91-540-4979-2), published by Svenska Statens Byggforskningsrad, it is shown that it is possible to achieve substantially as good efficiency, concerning increasing the heat transfer, using an infrasonic generator as using a fan. However, the infrasonic generator has a disadvantage in that it works effectively if the heat sink has dimensions that are similar or less than particle movements of the air motion that is generated by the infrasonic generator. The size of the particle movements is usually in the order of 1 cm and less. As the heat sinks usually need to be considerably larger, this way to increase the heat transfer has not come to a wide practical use.

PRESENTATION OF THE INVENTION

The present invention refers to the problem of providing a device for increasing the heat transfer from an object.

In short, the problem stated above is solved with a device, which comprises one or more oscillating membranes to generate an air motion in air surrounding the object. Further, the device comprises means for affecting the air motion so that this causes a continuous exchange of the air surrounding the object. From the continuous exchange of the surrounding air follows that the object all the time is surrounded by relatively cold air, and therefore the heat transfer from the object to the surrounding air is efficient.

An object of the invention is thus to provide a device for increasing the heat transfer from an object.

The problem stated above can be solved in more detail according to the following. The means to affect the air motion comprises one or more nozzles with flow resistances depending upon the direction of the flow. The nozzle (nozzles) causes a net flow of air through the nozzle, whereby the device is arranged to take advantage of the net flow of air, to obtain the continuous exchange of air surrounding the object. The object is, for example, a heat sink which, for example, is used for cooling electronics or something else. Another example is that the object comprises electronics or something else that is to be cooled.

The invention has, apart from solving the problem stated above, the advantage that the device is relatively quiet and therefore does not disturb the surroundings, especially if the membrane (membranes) is arranged to oscillate with a frequency in the infrasonic sound range. Further advantages are that the membrane (membranes) takes little room and comprises no parts, such as bearings or the like, requiring continuous maintenance.

The invention will now be described more closely with the aid of preferred embodiments and with reference to the attached drawings.

PREFERRED EMBODIMENTS

Figure 1:
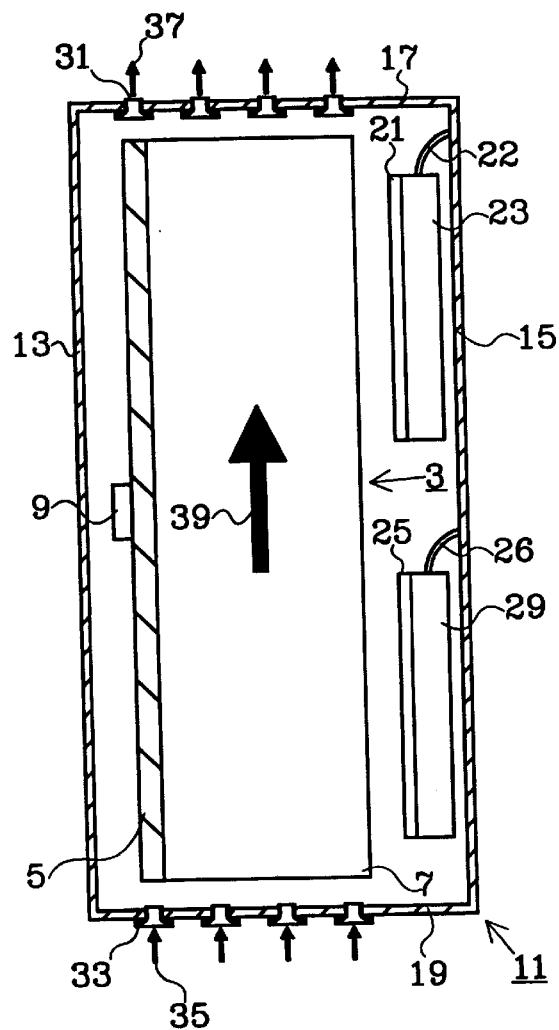
FIG. 1 shows, in a sectional view, as an example according to the invention, a first device for increasing the heat transfer from a heat sink.

FIG. 1 shows, in a sectional view, as an example according to the invention, a first device 1 for increasing the heat transfer from a heat sink 3 to air surrounding the heat sink 3.

The heat sink 3 in FIG. 1 comprises a ground plate 5 with good thermal conductivity on which electronics 9 that is to be cooled is arranged. The expression "electronics" comprises here all kinds of electronic equipment, such as electronic components, electronic circuits, radio equipment, microwave equipment, etc. Further, the heat sink comprises a predetermined number of heat dissipators in the form of cooling flanges 7, which are arranged on the ground plate 5 on the opposite side of the electronics 9. Of course, the invention is not limited to only this kind of heat sink 3; rather the person skilled in the art has the possibility, according to the circumstances and his/her own desire, to arrange this in another way. The heat sink 3 is arranged in a space in a cabinet 11, which in the example shown in FIG. 1 is made of sheet metal. The invention is not limited only to this material; rather a person skilled in the art has the possibility to choose another suitable material for the cabinet 11, according to the circumstances and his/her own desire, e.g. plastics or something else. The cabinet 11 comprises a first wall 13 and a second wall 15, which is oppo-site to the first wall 13. The cabinet 11 further comprises an upper part 17 and a lower part 19. Also the cabinet 11 further comprises walls (not shown), which, together with the first and the second walls 13 and 15 and the upper part 17 and the lower part 19, encloses the space in which the heat sink 3 is arranged.

In the example shown in FIG. 1, the cabinet 11 is oriented so that the first and the second walls 13 and 15 are substantially vertical, but the invention is, of course, not limited only to this orientation of the cabinet 11. The expression "cabinet" here also comprises cases, boxes, containers, jars, bottles and other means with which an equivalent function can be achieved as with the cabinet 11 in FIG. 1.

The first device 1 further comprises a first oscillating membrane 21, which is arranged on a first frame 23, and a second oscillating membrane 25, which is arranged on a second frame 29. The first and the second membranes 21 and 25 and the first and the second frames 23 and 29 are arranged in the space in the cabinet 11 so that the membranes 21 and 25 are facing the cooling flanges 7 of the heat sink 3. The two membranes 21 and 25 are arranged to oscillate in anti-phase to thereby counteract vibrations.

The first and the second membranes 21 and 25 generate an air motion in the air surrounding the heat sink 3. Normally, the air motion generated by the membranes 21 and 25 would correspond to a fluctuating flow velocity (without any actual mean velocity), and therefore the heat sink 3 would mainly be surrounded by the same air all the time. However, the first device 1 comprises means for affecting the air motion so that a continuous exchange of the air surrounding the heat sink 3 takes place. Thus, the first device 1 comprises a first set of nozzles 31, which are arranged through the upper part 17 of the cabinet 11 so that air in the cabinet 11 is joined with air outside the cabinet 11. The first set of nozzles 31 is arranged directly above the heat sink 3. The first set of nozzles 31 is arranged so that the nozzles have a greater flow resistance to flow into the cabinet 11 than to flow in the opposite direction. The first device 1 also comprises a second set of nozzles 33, which is arranged on the lower part 19 of the cabinet 11 so that the air in the cabinet 11 is joined with the air outside the cabinet 11. The second set of nozzles 33 is arranged directly below the heat sink 3. The second set of nozzles 33 is arranged so that the nozzles have a higher flow resistance to flow out of the cabinet 11 than to flow in the opposite direction. Taking place through the second set of nozzles 33 is a net inflow 35 of air to the cabinet 11, and taking place through the first set of nozzles 31 is, in a corresponding way, a net outflow 37 of air out of the cabinet 11. Thus, an airflow 39 is created through the cabinet 11 from the lower part 19 to the upper part 17, which means that there is a continuous exchange of the air surrounding the heat sink 3. The continuous exchange of air surrounding the heat sink 3 causes the surrounding air to always be relatively cold, and therefore heat to be transferred in an effective way from the heat sink 3 to the surrounding air. In the example shown in FIG. 1, both the first and the second sets of nozzles 31 and 33 comprise four nozzles, but the invention is, of course, not limited to only these numbers.

How strong the airflow 39 through the cabinet 11 becomes (and thereby also how large the increase of the heat transfer from the heat sink 3 becomes) is decided by the size (area) of the membranes 21 and 25 and amplitude and frequency of the oscillation of the membranes 21 and 25. The person skilled in the art has the possibility, according to the circumstances, such as space requirements and requirements on the increase of the heat transfer from the heat sink 3, to choose the size of the membranes 21 and 25 and the amplitude and the frequency of the oscillation of the membranes in a suitable way.

Figure 2:
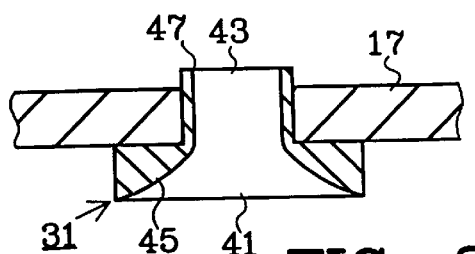
FIG. 2 shows, in a sectional view, as an example according to the invention, a nozzle with flow resistances dependent upon the direction of the flow.

FIG. 2 shows in a sectional view, in more detail, one of the nozzles 31 which is arranged through the upper part of the cabinet 11. The nozzles 33 on the lower part of the cabinet 11 are constructed in a way corresponding to the nozzle 31 in FIG. 2. The nozzle 31 in FIG. 2 comprises a first opening 41 on the inside of the cabinet 11 and a second opening 43 on the outside of the cabinet 11. The first opening 41 is larger than the second opening 43 and has rounded edges 45, while the second opening 43 has sharp edges 47. The flow resistance of the nozzle 31 in FIG. 2 is greater when air flows in through the second opening 43 and out through the first opening 41 than when air flows in the opposite direction. In order for the nozzle 31 to have a flow resistance which is strongly dependent upon the direction of the flow, the area $A_d$ of the second opening 43 and the distance l between the first opening 41 and the second opening 43 are chosen with consideration taken to the total surface $A_m$ of the membranes 21 and 25 and the amplitude a of the oscillation of the membranes 21 and 25 so that $$\frac{NA_d a}{A_m l} \ll 1,$$

where N refers to the total amount of nozzles 31 and 33 (N=8 in FIG. 1). According to the invention, it is especially suggested that the size of the diameters of the first and the second opening 41 and 43 and the distance between the first and the second openings 41 and 43 are in the order of 1 cm or less.

However, the invention is not limited to nozzles like the one in FIG. 2; rather, alternatively, other kinds of nozzles with flow resistances dependent upon the direction of the flow are used. Another alternative is to provide holes in the wall of the cabinet 11, whereby the holes are given a shape corresponding to the shape of the nozzle 31 in FIG. 2, or the shape of any other kind of nozzle with flow resistances dependent upon the direction of the flow. In this description, however, such holes, channels or other apertures with equivalent function are included in the concept of nozzle.

Figure 3:
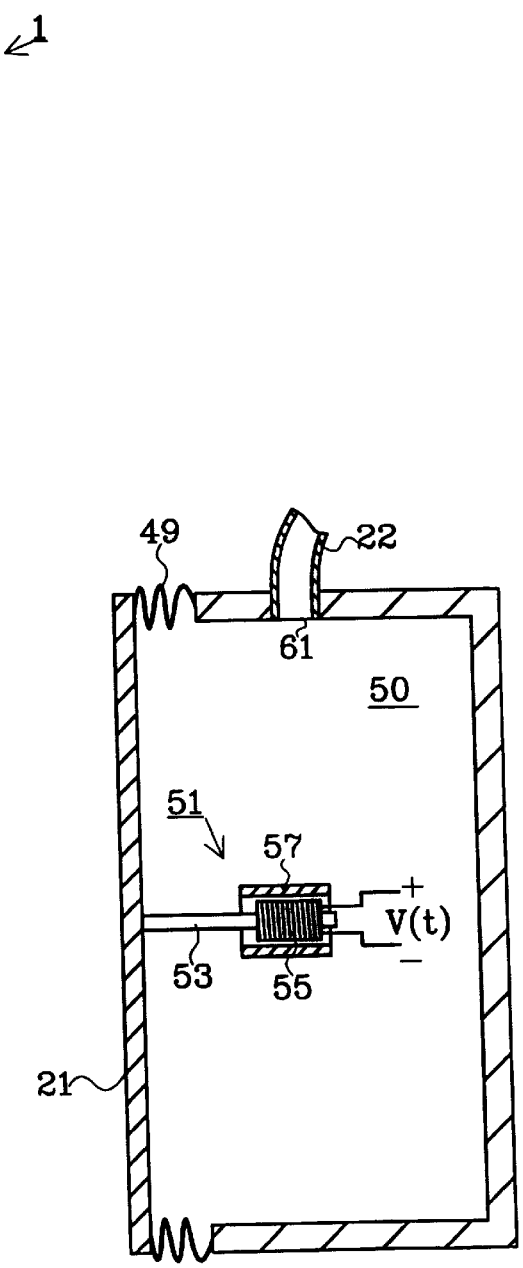
FIG. 3 shows, in a sectional view, as an example according to the invention, an oscillating membrane which is arranged on a frame.

FIG. 3 shows in a section view the first membrane 21 and the first frame 23 in more detail; the second membrane 25 and the second frame 29 are formed in a way corresponding to the first membrane 21 and the first frame 23. The first membrane 21 is, for example, made of composite material, steel, ceramics or plastics (sandwich). The first membrane 21 is arranged to the first frame 23, with an elastic, substantially non-dampening and airtight attachment 49. The attachment 49 is, for example, made of spring steel, composite materials (e.g. carbon fibre reinforced epoxy) or nonporous ceramics (e.g. pyrolytic boron nitride). The first membrane 21, the attachment 49 and the first frame 23 are so arranged that together they enclose a cavity 50. A actuating device 51 is arranged in the cavity 50 to give the first membrane 21 an oscillating motion. The actuating device 51 comprises a piston 53, which at one end is arranged to the first membrane 21. Further, a coil 55 is arranged on the piston 53, whereby the coil 55 and the piston 53 are arranged to run through a permanent magnet 57. In the cavity 50 there are also arranged means (not shown) for supplying the coil 55 with a varying voltage V(t). The varying voltage V(t) generates a current through the coil 55, whereby a varying force acts between the coil 55 and the permanent magnet 57. The force between the coil 55 and the permanent magnet 57 acts upon the piston 53, which in turn actuates the first membrane 21. A hole 61 is arranged through the first frame. A first hose 22 (also shown in FIG. 1) is with a first end arranged adjacent to the hole 61. A second end of the first hose 22 is arranged through the second wall 15 of the cabinet 11. Through the first hose 22, air in the cavity 50 is joined with air outside the cabinet 11, which makes the actuation of the first membrane 21 easier.

A second hose 26 is, in a manner corresponding to the first hose, arranged between the second frame 29 and the second wall 15 of the cabinet, as shown in FIG. 1.

The invention is, of course, not limited only to the kind of actuating device shown in FIG. 3; rather the person skilled in the art has the possibility to choose some other kind of actuating device according to the circumstances. An alternative is that the permanent magnet 57 is replaced by some other kind of magnet field generating device, e.g. a coil subjected to an electric current. Another alternative is that the piston 53 is formed as a permanent magnet, which is arranged to run through a coil, which generates a varying magnet field, which affects the piston 53 with a varying force. A further alternative is to use a so-called electrostatic actuating device. The electrostatic actuating device is arranged to take advantage of the force acting between electric charges. For example, in such an alternative, the first membrane 21 constitutes a first electrode, whereby a fixed second electrode is arranged substantially parallel to the first membrane 21. By providing a varying voltage between the electrodes, a varying force acting between the electrodes is obtained, whereby the first membrane 21 thereby is given an oscillating motion.

In the example shown in FIG. 3, the varying voltage V(t) is adapted to the first membrane 21 oscillating with its natural frequency, to thereby minimize the power consumed to actuate the first membrane 21. The natural frequency of the first membrane 21 is determined mainly by the mass of the first membrane and a spring stiffness of the attachment 49, which is well-known to the person skilled in the art. However, the invention is not limited to actuating the first membrane 21 so that it oscillates with its natural frequency; rather, the person skilled in the art has the possibility of actuating the first membrane 21 in another way, according to the circumstances. The first membrane 21 is substantially stiff. "Substantially stiff" in this context means that the first membrane 21 is stiff compared to the attachment 49 at the frequency at which the first membrane 21 is oscillating.

The invention is not limited to membranes of the type shown in the example in FIG. 3. Alternatively, a conventional speaker membrane, a flexible membrane or any other type of membrane is used.

According to the invention it is suggested that the first and the second membrane 21 and 25 are arranged to oscillate with frequencies in the infrasonic range, i.e. with frequencies which are not audible to the human ear, usually (varies from person to person) frequencies around 30 Hz and therebelow. Especially it is suggested that both the membranes 21 and 25 oscillate with frequencies in the interval 20–30 Hz, which gives, on one hand, very quiet actuation, on the other hand, a relatively effective exchange of the air surrounding the heat sink 3. An advantage with using infrasonic frequencies is that this does not disturb the surroundings. However, the invention is not limited to the infrasonic range, and even if the first and second membranes 21 and 25 are arranged to oscillate with audible frequencies (>30 Hz), they will cause considerably less disturbing sound than e.g. a fan.

Figure 4:
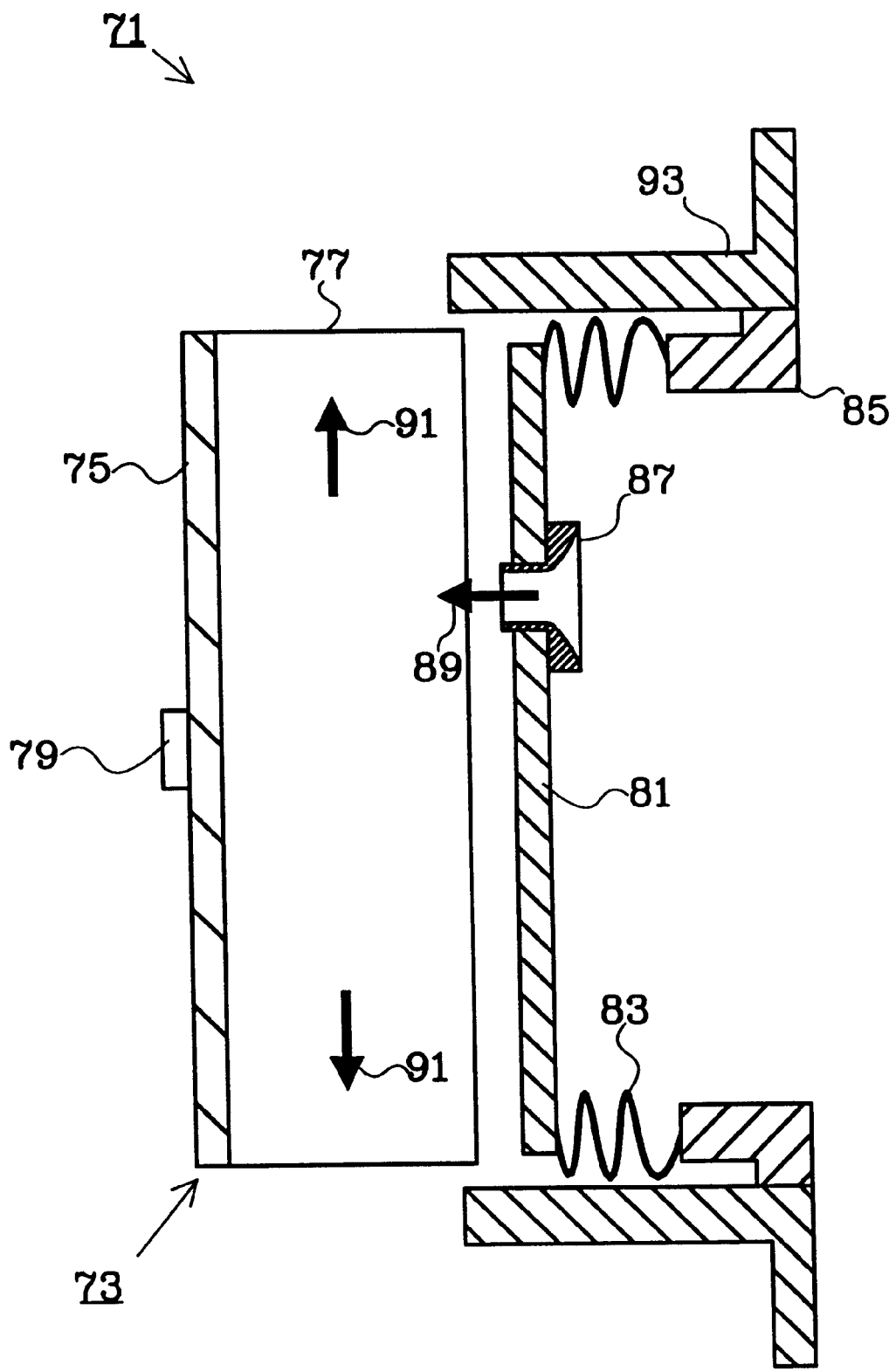
FIG. 4 shows, in a sectional view, as an example according to the invention, a second device for increasing the heat transfer from a heat sink.

FIG. 4 shows, in a sectional view, as an example according to the invention, a second device 71 for increasing the heat transfer from a heat sink 73.

The heat sink 73 in FIG. 4 comprises, in a manner corresponding to the heat sink 3 in FIG. 1, a ground plate 75 with a number of cooling flanges 77. Electronics 79, which is to be cooled, is arranged on the ground plate 75 in good thermal contact with the ground plate 75. The second device 71 comprises an oscillating membrane 81, which is arranged by a frame 85 with an elastic, non-dampening and airtight attachment 83. The second device 71 also comprises an actuating device (not shown) for actuating the membrane 81. A first side of the membrane 81 is turned towards the cooling flanges 77 of the heat sink 73. The heat sink 73 is arranged directly in front of the membrane 81. The frame 85 is open towards a second side of the membrane 81, whereby the second side of the membrane 81 is turned away from the heat sink 73. The membrane 81 is substantially stiff. A nozzle 87 is arranged through the membrane 81 so that air on the first side of the membrane 81 is joined with air on the second side of the membrane 81. The construction of the nozzle 87 in FIG. 4 corresponds to the construction of the nozzle 31 in FIG. 2, but, alternatively, the nozzle 87 is formed in another way. The nozzle 87 is arranged to have a greater flow resistance to airflow from the first side of the membrane 81 to the second side of the membrane 81 than to flow in the opposite direction. When the membrane 81 is oscillating, there is a net flow 89 of air from the second side of the membrane 81 to the first side of the membrane 81. The net flow 89 of air, caused by the nozzle, causes in turn air streams 91 along the heat sink 73, primarily around the cooling flanges 77. The air streams 99 along the heat sink 73 cause a continuous exchange of the air surrounding the heat sink 73. The continuous exchange of air which surrounds the heat sink 73 causes the air surrounding the heat sink 73 to be relatively cold all the time, and therefore heat is transferred in an effective way from the heat sink 73 to the surrounding air. Furthermore, a screen 93 arranged by the frame 85 for guiding the net flow 89 of air, generated by the nozzle 81, towards the heat sink 73 in an effective way. The screen 93 is also arranged to prevent air, which has already been heated by the heat sink 73, to be transported to the second side of the membrane 81.

In the example shown in FIG. 4, only one nozzle 87 is arranged through the membrane 81. The invention is, of course, not limited to this, rather, alternatively, also further nozzles are arranged through the membrane 81. Alternatively, the nozzle 87 (nozzles) are instead turned in the opposite direction, whereby the airflow takes place in the opposite direction compared to the example shown in FIG. 4.

Figure 5:
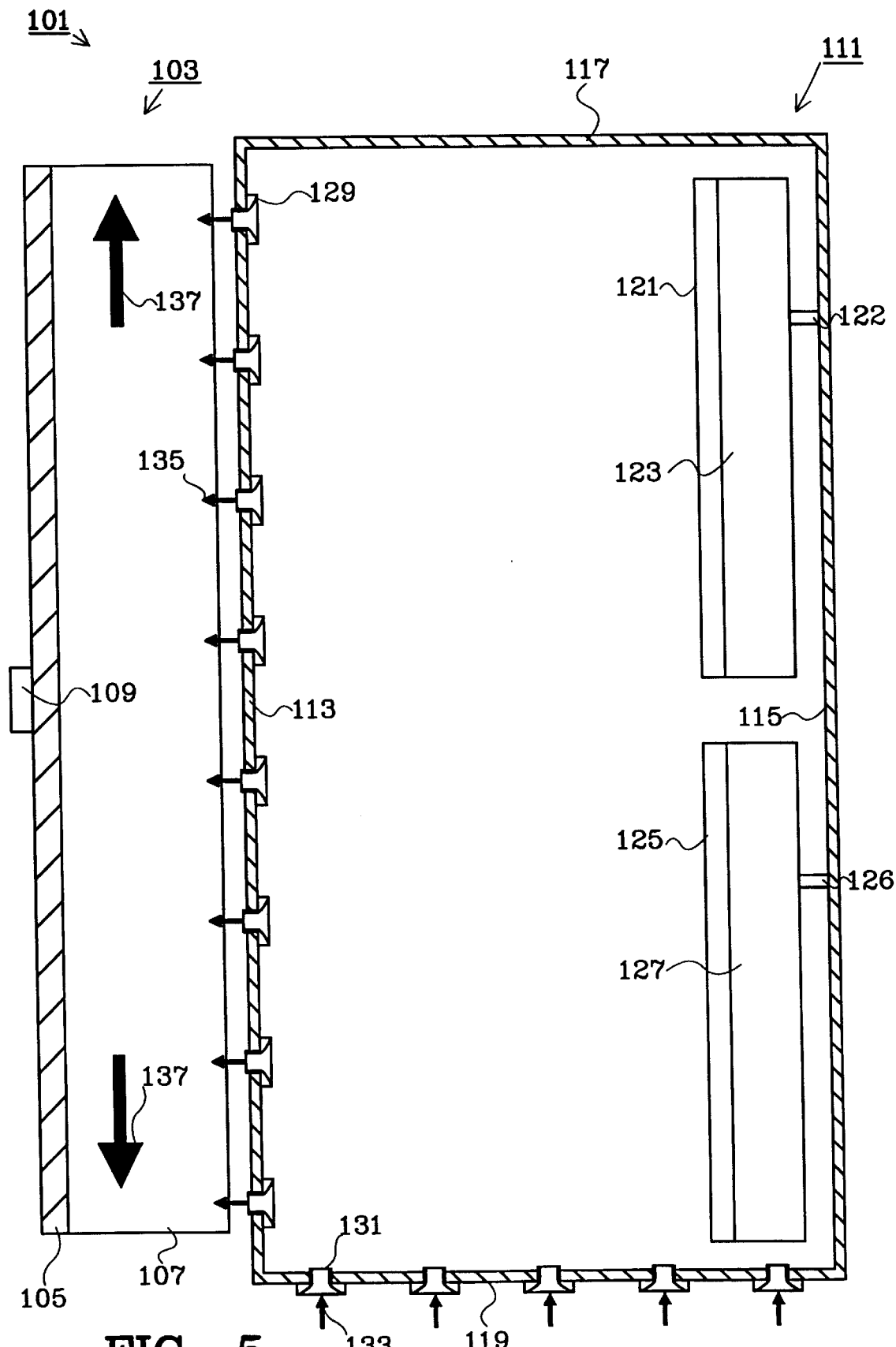
FIG. 5 shows, in a sectional view, as an example according to the invention, a third device for increasing the heat transfer from a heat sink.

FIG. 5 shows, in a sectional view, as an example according to the invention, a third device 101 for increasing the heat transfer from a heat sink 103.

The third device 101 comprises a cabinet 111 with a first wall 113 and a second wall 115, which is opposite to the first wall 113. Further, the cabinet comprises an upper part 117 and a lower part 119 and further walls (not shown), which, together with the first and the second walls 113 and 115 and the upper part 117 and the lower part 119, encloses a space.

In the space in the cabinet 111, a first and a second oscillating membrane 121 and 125 are arranged. The first membrane 121 is arranged on a first frame 123, and in a corresponding way the second membrane 125 is arranged on a second frame 127. The first and the second membranes 121 and 125 and the first and the second frames 123 and 127 of the third device 101 are formed in a way corresponding to the first and the second membranes 21 and 25 and the first and the second frames 23 and 29 of the first device 1. A first hose 122 is arranged between the first frame 123 and the second wall 115, so that air in a cavity (not shown in FIG. 5), formed by the first membrane 121 and the first frame 123, is joined with air outside the cabinet 111. In a corresponding way, a second hose 126 is arranged between the second frame 127 and the second wall 115.

A first set of nozzles 129 is arranges through the first wall 113, so that air in the cabinet 111 is joined with air outside the cabinet 111. The first set of nozzles 129 is arranged so that the nozzles have a greater flow resistance to airflow into the cabinet 111 than to airflow in the opposite direction. A second set of nozzles 131 is arranged through the lower part 119 of the cabinet 111, so that the air in the cabinet 111 is joined with the air outside the cabinet 111. The second set of nozzles 131 is arranged so that the nozzles have a greater flow resistance to airflow out of the cabinet 111 than to airflow in the opposite direction. The design of the first and the second set of nozzles 129 and 131 corresponds to the design of the nozzle 31 in FIG. 2, but alternatively the nozzles 129 and 131 are formed in another way. In the example shown in FIG. 5 there are eight nozzles in the first set of nozzles 129 and five nozzles in the second set of nozzles 131, but the invention is, of course, not limited to only these numbers.

The heat sink 103 in FIG. 5 comprises, in a way corresponding to the heat sink 3 in FIG. 1, a ground plate 105 on which a number of cooling flanges 107 are arranged. Furthermore, electronics 109, which is to be cooled, is arranged on the ground plate 105 in good thermal contact with the ground plate 105. The heat sink 103 is arranged outside the cabinet 111 by the first wall 113 adjacent to the first set of nozzles 129, whereby the cooling flanges 107 are turned towards the first set of nozzles 129. Through the second set of nozzles there is a net inflow 133 of air into the cabinet 111, and in a corresponding way there is a net outflow 135 of air out of the cabinet 111 through the first set of nozzles 129. The net outflow 135 of air through the first set of nozzles 129 causes air streams 137 along the heat sink 103, primarily around the cooling flanges 107. The air streams 137 cause a continuous exchange of the air surrounding the heat sink 103, and therefore the heat transfer from the heat sink 103 to the surrounding air is substantially improved.

In an alternative to the third device 101, the nozzles 129 and 131 are turned in the opposite direction, whereby the airflow takes place in the opposite direction compared to the example shown in FIG. 5.

An advantage with the embodiment in FIG. 5 is that the heat sink 103 is arranged outside the cabinet 111. If the membranes 121 and 125 for any reason would stop, for example, as a result of an electric failure which affects the actuating devices (not shown) actuating the membranes, the heat sink would still transfer heat to the surrounding air somehow effectively, and therefore the electronics 109 would not run an immediate risk of being overheated. The embodiment in FIG. 4 has of course the corresponding advantage.

Figure 6:
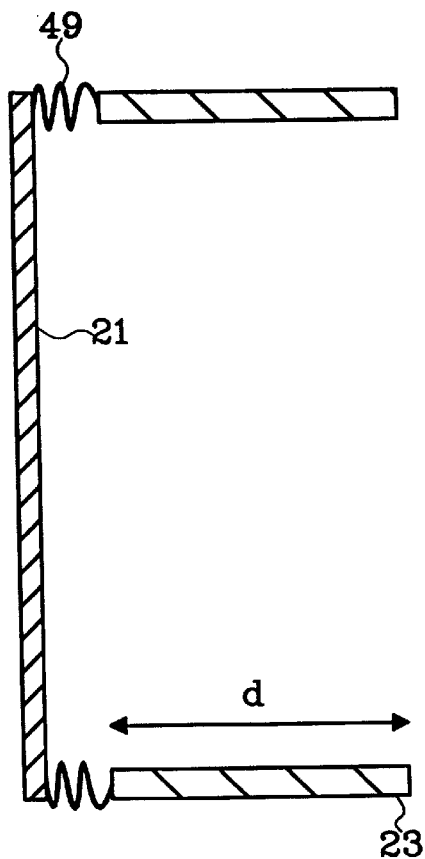
FIG. 6 shows, in a sectional view, as an example according to the invention, an alternative form of the oscillating membrane and the frame.

The form of the first membrane 21 and the first frame 23 in FIG. 3 causes the first membrane 21 to substantially correspond to an acoustic monopole, which means that the first membrane 21 generates a relatively strong sound pressure field. FIG. 6 shows, in a sectional view, as an example according to the invention, an alternative form of the first membrane 21 and the first frame 23. In FIG. 6, the first frame 23 is completely open towards a backside side of the first membrane 21.

The form of the first membrane 21 and the first frame 23 in FIG. 6 causes the first membrane 21 to substantially correspond to an acoustic dipole. The sound pressure field generated by the first membrane 21 in the example shown in FIG. 6, is therefore weaker compared to the sound pressure field that the monopole (FIG. 3) generate, especially at far field distances from the first membrane 21. Far field distance refers to a distance r from the first membrane 21, for which it is true that k r>>1, where k refers to the wave number. In a corresponding way, near field distance refers to a distance r from the first membrane 21, for which it is true that k r<<1. For frequencies between 10 and 40 Hz, far field distance means approximately 5 meters and more, and near field distances approximately 1 meter and less. In the example shown in FIG. 6, the depth d of the frame 23 is adapted so that a sound pressure level as great as possible is obtained. The sound pressure level at near field distances from the first membrane 21 in FIG. 6 is therefore sufficiently high for an effective increase of the heat transfer from the heat sink 3 to be obtained. At the same time, the sound pressure level on far field distances is relatively low, and therefore any disturbing influence on the surroundings is avoided.

Figure 7:
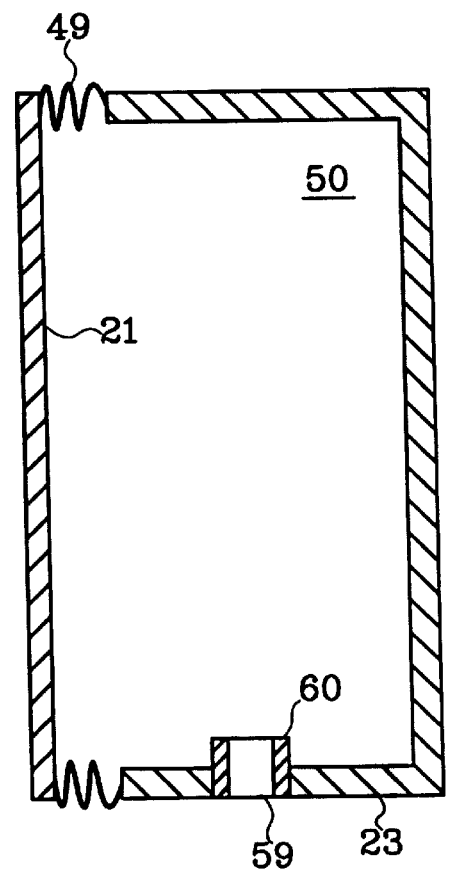
FIG. 7 shows, in a sectional view, as an example according to the invention, a further alternative form of the oscillating membrane and the frame.

FIG. 7 shows, in a sectional view, as an example according to the invention, a further alternative form of the first membrane 21 and the first frame 23. In the example shown in FIG. 7, the first membrane 21 and the first frame 23 are arranged to form a Helmholtz resonator. A hole 59 is provided through the frame 23, so that air in the cavity 50 is joined with air outside the cavity 50, and a tube 60 is provided adjacent to the hole 59. The resonance frequency of the Helmholtz resonator is determined, as is known to the person skilled in the art, by a mass of air in the tube 60 and the volume of the cavity 50. In the example shown in FIG. 7, the resonance frequency of the Helmholtz resonator is tuned in relation to the frequency by which the first membrane 21 is oscillated, which means that the actuation of the first membrane 21 requires less power.

For the reader who is interested in reading more about the acoustic features of the examples in FIG. 6 and 7, reference is here made to J. Liljencrantz, "Elektroakustik", p. 5–16, KTH, Trita-Tom 1993, ISSN 0280-9850.

The invention is not limited to increasing the heat transfer from a heat sink, rather, alternatively, the invention is used for increasing the heat transfer from another object, e.g. electronics.

The invention can be used for all technical applications, where heat transfer from a heat sink of any other object needs to be increased, for example, when cooling electronics or other units. The invention is especially useful for technical applications, where it is necessary that the technical equipment must not take a lot of room and/or that the technical equipment must work during a long period of time without maintenance. The invention is, for example, particularly applicable when cooling electronics in radio base stations.

What is claimed is:

1. A device for increasing heat transfer from an object, comprising:
   at least one oscillating membrane for generating air motion in air surrounding the object;
   means for affecting the air motion so that the air motion causes a continuous exchange of the air surrounding the object, wherein the means for affecting the air motion comprises at least one always-open nozzle having different flow resistances for different flow directions.

2. A device according to claim 1, wherein the means for affecting the air motion comprise
   a cabinet with a space, at least one of the membranes being arranged in the space,
   a first nozzle arranged to permit flow communication between air in the cabinet and air outside the cabinet, the first nozzle having a greater flow resistance to airflow in a direction into the cabinet than in an opposite direction to the direction into the cabinet; and
   a second nozzle being arranged to permit flow communication between air in the cabinet and air outside the cabinet, the second nozzle having a greater flow resistance to airflow in a direction out of the cabinet than in an opposite direction to the direction out of the cabinent.

3. A device according to claim 2, wherein the object is arranged outside the cabinet.

4. A device according to claim 3, wherein the object is arranged adjacent to one of the first and the second nozzle.

5. A device according to claim 1, the device comprising at least one first membrane and at least one second membrane, the at least one first membrane and the at least one second membrane being arranged to oscillate out of phase with each other to reduce vibrations.

6. A device according to claim 5, wherein the at least one first membrane and the at least one second membrane each includes an actuating device to cause the at least one first membrane and the at least one second membrane to oscillate in anti-phase.

7. A device according to claim 1, wherein at least one of the at least one first membrane and the at least one second membrane includes an actuating device to cause the at least one of the at least one first membrane and the at least one second membrane to oscillate with a frequency that is substantially equal to or less than 30 Hz.

8. A device according to claim 7, wherein at least one of the at least one first membrane and the at least one second membrane is arranged to oscillate with a frequency in the interval 20 to 30 Hz.

9. A device according to claim 1, wherein the at least one membrane is arranged to oscillate with its natural frequency.

10. A device according to claim 1, wherein the object is a heat sink.

11. A device according to claim 10, wherein a unit to be cooled is thermally connected to the heat sink.

12. A device according to claim 11, wherein the unit comprises electronics.

13. A device according to claim 1, wherein the object comprises electronics.

14. A device according to claim 1, wherein the at least one nozzle has a length of 1 cm or less.

15. A device for increasing heat transfer from an object, comprising:
   at least one oscillating membrane for generating air motion in air surrounding the object;
   means for affecting the air motion so that the air motion causes a continuous exchange of the air surrounding the object, the means for affecting the air motion including at least one nozzle having different flow resistances for different flow directions, a cabinet with a space, at least one of the membranes being arranged in the space, a first nozzle arranged to permit flow communication between air in the cabinet and air outside the cabinet, the first nozzle having a greater flow resistance to airflow in a direction into the cabinet than in an opposite direction to the direction into the cabinet, and a second nozzle being arranged to permit flow communication between air in the cabinet and air outside the cabinet, the second nozzle having a greater flow resistance to airflow in a direction out of the cabinet than in an opposite direction to the direction out of the cabinet, and wherein the object is disposed in the cabinet.

16. A device according to claim 15, wherein the object is arranged between the first and the second nozzles.

17. A device for increasing heat transfer from an object, comprising:
   at least one oscillating membrane for generating air motion in air surrounding the object;
   means for affecting the air motion so that the air motion causes a continuous exchange of the air surrounding the object, the means for affecting the air motion including at least one nozzle having different flow resistances for different flow directions, and wherein at least one of the membranes is stiff and at least one nozzle is arranged through the stiff membrane so that air on a first side of the stiff membrane is in flow communication, via the nozzle, with air on a second side of the stiff membrane.

18. A device according to claim 17, wherein the object is arranged on the first side of the stiff membrane.

19. A device according to claim 18, wherein an air supply is provided on the second side of the membrane.

20. A device according to claim 19, further comprising means for preventing air heated by the object from being transported to the second side of the membrane.

* * * * *